(12) United States Patent
Kruglick

(10) Patent No.: US 8,664,539 B2
(45) Date of Patent: Mar. 4, 2014

(54) INTEGRATED CIRCUIT NANOWIRES

(75) Inventor: Ezekiel Kruglick, Poway, CA (US)

(73) Assignee: Empire Technology Development LLC, Wilmington, DE (US)

( * ) Notice: Subject to any disclaimer, the term of this patent is extended or adjusted under 35 U.S.C. 154(b) by 49 days.

(21) Appl. No.: 13/371,782

(22) Filed: Feb. 13, 2012

(65) Prior Publication Data

US 2012/0146227 A1 Jun. 14, 2012

Related U.S. Application Data

(62) Division of application No. 12/389,236, filed on Feb. 19, 2009, now Pat. No. 8,114,787.

(51) Int. Cl.
*H05K 1/16* (2006.01)
*H05K 1/11* (2006.01)

(52) U.S. Cl.
USPC .......................................... 174/260; 174/261

(58) Field of Classification Search
USPC ................................. 174/260–261
See application file for complete search history.

(56) References Cited

U.S. PATENT DOCUMENTS

| | | | |
|---|---|---|---|
| 5,650,360 A | 7/1997 | Tomita | |
| 6,177,291 B1 | 1/2001 | Eriguchi et al. | |
| 6,476,409 B2 | 11/2002 | Iwasaki et al. | |
| 6,709,929 B2 | 3/2004 | Zhang et al. | |
| 7,098,144 B2 | 8/2006 | Zhang et al. | |
| 7,255,745 B2 | 8/2007 | Zhang et al. | |
| 7,265,375 B2 | 9/2007 | Zhang et al. | |
| 7,629,629 B2 | 12/2009 | Saitoh et al. | |
| 7,803,712 B2 | 9/2010 | Komilovich et al. | |
| 7,833,842 B2 | 11/2010 | Williams et al. | |
| 2004/0033679 A1 | 2/2004 | Jacobson et al. | |
| 2006/0038293 A1 | 2/2006 | Rueger | |
| 2006/0220172 A1 | 10/2006 | Farrar | |
| 2007/0238291 A1 | 10/2007 | Snider | |
| 2008/0003818 A1 | 1/2008 | Seidel et al. | |
| 2008/0116481 A1 | 5/2008 | Sharma | |
| 2008/0290337 A1 | 11/2008 | Halik et al. | |
| 2010/0112776 A1 | 5/2010 | Kondoh et al. | |
| 2010/0155698 A1 | 6/2010 | Lieber et al. | |

FOREIGN PATENT DOCUMENTS

| | | |
|---|---|---|
| JP | 63-301548 A | 8/1988 |
| JP | 63296243 A | 12/1988 |
| JP | S63296243 A | 12/1988 |
| JP | 2000-269420 A | 9/2000 |
| JP | 2004-363584 A | 12/2004 |
| JP | 2005-276864 A | 10/2005 |
| JP | 2006-237313 A | 9/2006 |
| JP | 2007287890 A | 1/2007 |
| JP | 2007-536748 A | 12/2007 |
| JP | 2008-124188 A | 5/2008 |
| JP | 2008-244420 A | 10/2008 |
| JP | 2008-270545 A | 11/2008 |
| JP | 2009-525193 A | 7/2009 |

(Continued)

OTHER PUBLICATIONS

Kondoh, E. et al. "Paving the way for Full-Fluid IC Metallization using Supercritical Carbon Dioxide", Proceedings of the IEEE 2003 International Interconnect Technology Conference, Jun. 2-4, 2003, pp. 141-143.

(Continued)

*Primary Examiner* — Jeremy Norris

(57) ABSTRACT

Implementations of encapsulated nanowires are disclosed.

17 Claims, 6 Drawing Sheets

(56) References Cited

FOREIGN PATENT DOCUMENTS

| WO | 2006070670 A1 | 7/2006 |
| WO | 2007-089522 A1 | 8/2007 |
| WO | 2007086009 A1 | 8/2007 |

OTHER PUBLICATIONS

Xia, Younan, et al. "One-Dimensional Nanostructures—Synthesis, Characterization and Applications", Advanced Materials, Mar. 4, 2003, 15, No. 5, pp. 353-389.

Hernandez-Velez, M. "Nanowires and 1D Arrays Fabrication: An Overview", Thin Solid Films 2006, 495, pp. 51-63, Elsevier, online at Science Direct.

Resch, Roland et al. "Immobilizing Au Nanoparticles on SiO2 Surfaces Using Octadecylsiloxane Monolayers", Langmuir 2001, 17, pp. 5666-5670.

Alaca, B. Erdem. "Guided self-assembly of metallic nanowires and channels", Applied Physics Letters, Jun. 7, 2004, 84, 23, pp. 4669-4671.

Cheyney, Tom. "E-beam, nanoimprint, and novel lithographies approach semiconductor mainstream", Small Times, Mar. 7, 2008, available online at http://www.smalltimes.com/articles/article_display.cfm? ARTICLE_ID=322356&p=109, PennWell Corporation, Tulsa, OK.

O'Neil, A, et al., Fabrication of device nanostructures using supercritical fluids, MRS Bulletin Mater. Res. Soc USA, vol. 30, No. 12, Dec. 2005, pp. 967-975.

Kalblein, D., et al., Top-gate ZnO nanowire transistors with ultrathin organic gate dielectric, 2009 67th Annual Device Research Conference (DRC) IEEE Piscataway, NJ, USA, 2009, p. 17-18.

European Patent Office, EP Search Report for Application No. 09180923.6-1235, mailed on Jun. 17, 2010.

US 8,664,539 B2

INTEGRATED CIRCUIT NANOWIRES

CROSS-REFERENCE TO RELATED APPLICATIONS

This application is a divisional of and claims priority to U.S. patent application Ser. No. 12/389,236, with projected U.S. Pat. No. 8,114,787 and projected issue date of Feb. 14, 2012, filed on Feb. 19, 2009 and entitled "Integrated Circuit Nanowires", the entire contents of which are incorporated herein by reference.

BACKGROUND

Nanowires are expected to become important functional components as integrated circuits (ICs) continue to shrink in size. In addition to enabling smaller circuit dimensions, nanowires are known to exhibit low capacitance and therefore should also help to reduce power consumption and enhance signal speeds in future ICs. Existing methods for producing nanowires include using metal organic chemical vapor deposition (MOCVD) of iridium oxide on a growth promoting film, and metal deposition at an angle onto a textured surface. However, known methods of producing nanowires usually rely on high temperature processes inconsistent with IC integration.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

Figure 1A:
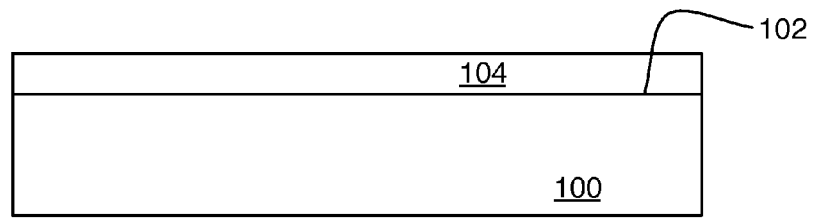
FIGS. 1A-1E illustrate a scheme and associated example structures for fabricating encapsulated nanowires.

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is drawn, inter alia, to methods, apparatus, and systems related to the production of encapsulated nanowires for use in integrated circuits.

In the following description, algorithms and/or symbolic representations of operations on data bits and/or binary digital signals stored within a computing system, such as within a computer and/or computing system memory may be presented. An algorithm is generally considered to be a self-consistent sequence of operations and/or similar processing leading to a desired result where the operations may involve physical manipulations of physical quantities that may take the form of electrical, magnetic and/or electromagnetic signals capable of being stored, transferred, combined, compared and/or otherwise manipulated. In various contexts such signals may be referred to as bits, data, values, elements, symbols, characters, terms, numbers, numerals, etc. Those skilled in the art will recognize, however, that such terms may be used to connote physical quantities. Hence, when terms such as "storing", "processing", "retrieving", "calculating", "determining" etc. are used in this description they may refer to the actions of a computing platform, such as a computer or a similar electronic computing device such as a cellular telephone, that manipulates and/or transforms data represented as physical quantities including electronic and/or magnetic quantities within the computing platform's processors, memories, registers, etc.

As used herein the term "nanowire" refers to any nanometer-sized conductive structure suitable for conveying electrical signals. Thus, the term nanowire as used herein should be broadly understood to encompass nanometer-sized wires, nanometer-sized contacts, nanometer-sized traces, nanometer-sized interconnects etc. Also, as used herein the term "nanometer-sized" may refer to structures having dimensions, such as a metal wire having a diameter, that range from a fraction of a nanometer to hundreds of nanometers in size.

FIGS. 1A-E illustrate methods and example structures for fabricating encapsulated nanowires. FIGS. 1A-E are provided for purposes of illustration and are not intended to depict structures having exact dimensionalities, shapes etc. nor to depict all components or structures that may be present in some implementations but that have been excluded from FIGS. 1A-E to avoid unnecessarily obscuring claimed subject matter.

FIG. 1A illustrates a substrate 100 which may be, but is not limited to, a silicon substrate. Substrate 100 has a surface 102 and a surface layer 104 disposed on surface 102. Surface layer 104 may be a layer of photoresist material. Further, surface layer 104 may be a photoresist layer suitable for patterning using lithography techniques.

Figure 1B:
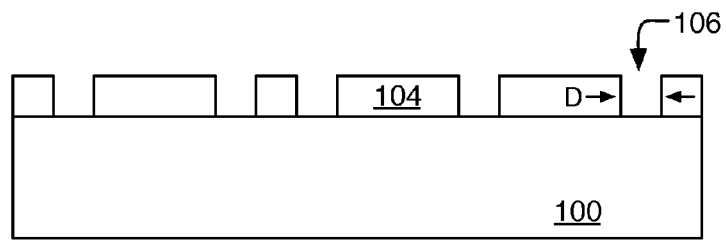

FIG. 1B illustrates substrate 102 after photoresist layer 104 has been lithographically patterned to form nanometer-sized features 106. In some implementations, photoresist layer 104 may be patterned using Nanoimprint Lithography (NIL) techniques. However, other embodiments are not limited in this regard, and thus, for example, photoresist layer 104 may be a photoresist layer suitable for patterning using optical lithography techniques such as Extreme Ultraviolet (EUV) lithography), or, for another example, photoresist layer 104 may be suitable for patterning using electron beam lithography techniques (e.g., Electron Beam Lithography (EBL)). In the structure depicted in FIG. 1B and subsequent figures, features 106 are illustrated corresponding to a cross-sectional view of nanometer-sized features that may extend horizontally over surface 102 of substrate 100 and that expose portions of surface 102. In some implementations, a diameter D of features 106 may range from about 1 to 100 nanometers.

Figure 1C:
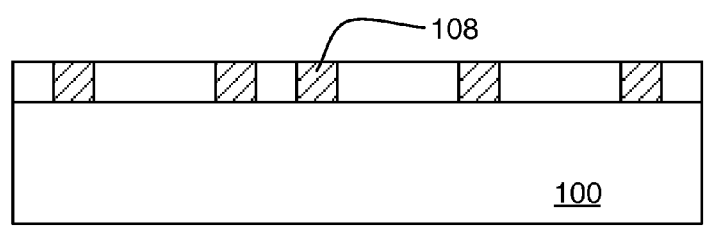

As illustrated in FIG. 1C, a conductive material 108 may be disposed in features 106 and thereby on those portions of the surface 102 of substrate 100 that are exposed by patterned photoresist layer 104. Conductive material 108 may be formed or deposited in features 106 by employing a metal precursor conveyed in supercritical carbon dioxide ($scCO_2$). For example, material 108 may include copper (Cu) deposited by placing substrate 100 including patterned photoresist layer 104 in a high-pressure reactor and exposing the substrate to a $scCO_2$ mixture including a Cu precursor. The reactor may be pressurized to 10-15 MPa of carbon dioxide and the metal deposition process may take place at temperatures of 180-350 °C. The $scCO_2$ mixture may include, in addition to carbon dioxide, hydrogen gas ($H_2$) and a Cu-organic precursor such as Cu(hexafluoroacetylacetate)$_2$ or Cu(diisobutylmethanate)$_2$. Alternatively, the $scCO_2$ mixture may employ Cu(hexafluoroacetylacetate)(aryloxytrimethylsilyl) as the Cu precursor and therefore may not include $H_2$.

Using the techniques described above, conductive material 108 may be deposited on those portions of surface 102 that are exposed within features 106. However, other embodiments are not limited to this example, and conductive material 108 may be disposed using techniques such as electrochemical deposition, sputtering, evaporation, etc. In some implementations, conductive material 108 may be metal and may include copper, aluminum, tungsten or any combination thereof, although other embodiments are not limited in this regard. In some implementations, techniques described herein for forming conductive material 108 may be performed at temperatures of less than about 350° C.

Figure 1D:
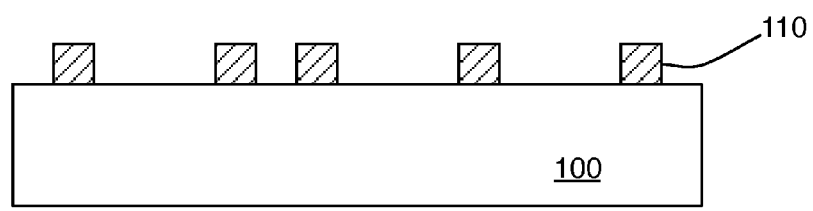

In FIG. 1D, the patterned photoresist layer 104 and/or any excess portions of conductive material 108 (e.g., portions of conductive material 108 that may be formed over patterned layer 104) may be removed using liftoff techniques to yield metal nanowires 110 on surface 102 of substrate 100. In other implementations, excess portions of conductive material 108 may be removed using planarization techniques and patterned photoresist layer 104 may be removed using techniques such as ash residue removal techniques to yield nanowires 110 on surface 102 of substrate 100.

Figure 1E:
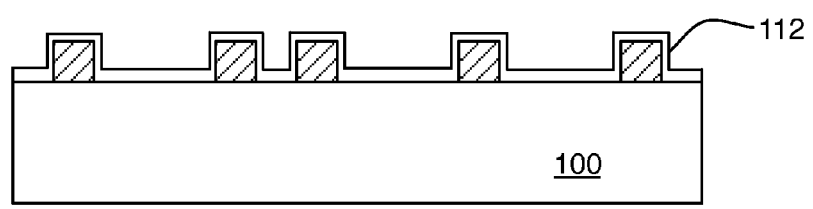

As shown in FIG. 1E, nanowires 110 may be encapsulated in an insulating material 112. In some implementations, insulating material 112 may include an encapsulating layer of silicon dioxide ($SiO_2$) deposited over and/or on nanowires 110. For example, insulating material 112 may be formed from Self-Assembled Monolayers (SAMs) derived from octadecylsiloxane (ODS) where, subsequent to deposition of a SAM on nanowires 110, the SAM may be oxidized by ultraviolet radiation in the presence of an ozone containing gas to form insulating material 112. For example, one way to form insulating material 112 involves depositing ODS over nanowires 110 by immersing substrate 100 bearing nanowires 110 in a solution of octadecyltrichlorosilane (OTS) in toluene at room temperature. The coated substrate may be rinsed in toluene, acetone, and ethanol, dried in a stream of pure nitrogen, and then oxidized by a 10-minute exposure to ultraviolet radiation in an ozone chamber to yield one layer of insulating material 112 encapsulating nanowires 110.

A single layer or SAM of insulating material 112 derived from the ODS technique just described may have a thickness of about 0.3 nm. Further, the SAM process described above may be repeated a number of times to increase the overall thickness of insulating material 112 by disposing multiple SAMs over nanowires 110. For example, repetition of the ODS process up to ten times may result in a thickness of insulating material 112 ranging from about 0.3 nm to 3 nm, or less than about 5 nm. The formation of insulating material 112 is not, however, limited to specific thicknesses of insulating material 112. Further, the formation of insulating material 112 is not limited to the use of the ODS techniques described herein, and hence, for example, insulating material 112 may be formed over nanowires 110 using other techniques such as plasma-enhanced chemical vapor deposition (PECVD) of $SiO_2$. In other implementations, insulating material may include other materials such as silicon nitride. In some implementations, techniques described herein for forming insulating material 112 may be performed at temperatures of less than about 350° C.

FIGS. 2A-E illustrate other methods and example structures for fabricating encapsulated nanowires. FIGS. 2A-E are provided for purposes of illustration and are not intended to depict structures having exact dimensionalities, shapes etc. nor to depict all components or structures that may be present in some implementations but that have been excluded from FIGS. 2A-E to avoid unnecessarily obscuring claimed subject matter.

Figure 2A:
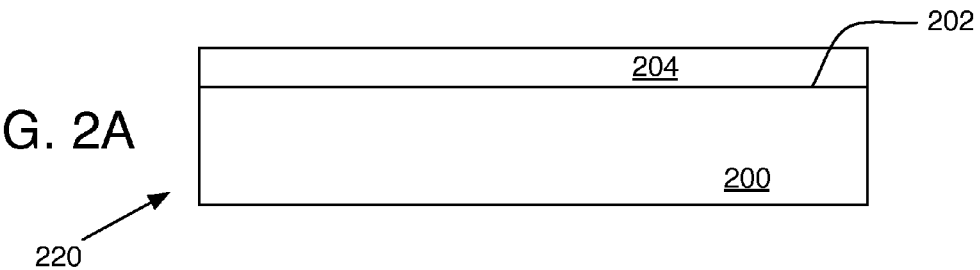
FIGS. 2A-2F illustrate another scheme and associated example structures for fabricating encapsulated nanowires.

FIG. 2A illustrates a portion 222 of a substrate 200 which may be, but is not limited to, a silicon substrate. Substrate 200 has a surface 202 and a surface layer 204 disposed on surface 202. In some implementations, layer 204 may be a layer of strained silicon dioxide although other embodiments are not limited in this regard.

Figure 2B:
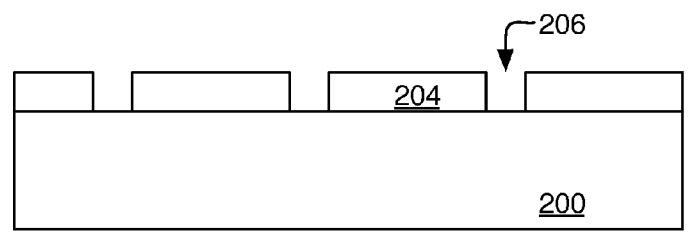

As shown in FIG. 2B, strained layer 204 may be subjected to thermal processing techniques to yield nanometer-sized cracks 206. For example, layer 204 may have been deposited by PECVD such that it had an initial stress of 200 MPa, and then cracks 206 may be formed in layer 204 by heating substrate 200 and layer 204 to a temperature of about 525° C. at a rate of about 5° C./min and then maintaining them at that temperature for at least 30 minutes.

Cracks 206 may be formed in a predetermined manner in layer 204 by etching patterns in substrate 200 prior to the formation of layer 204. For example, known inductively coupled plasma-deep reactive ion etching techniques may be used to form features (not shown in FIGS. 2A-2E) on the order of 10 μm in depth in surface 202 of substrate 200. During the processing of layer 204, sharp upper edges (e.g., sharp corners) of such features may act as origin sites for cracks 206, while free upper edges (e.g., smoothly varying edges) of such features may act as termination sites for cracks 206.

Figure 2C:
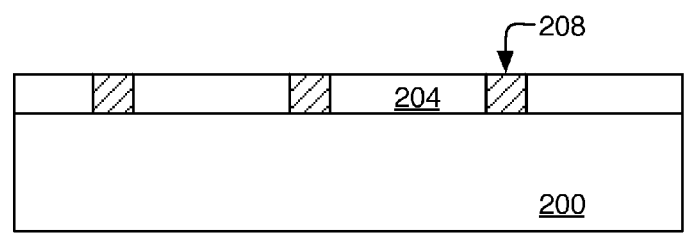
Figure 2D:
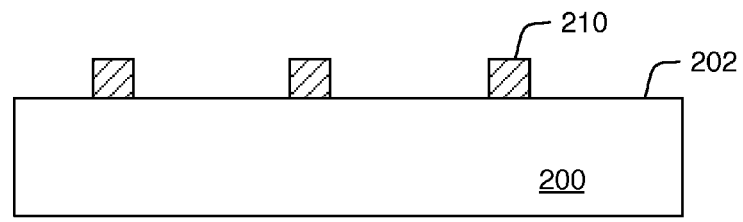
Figure 2E:
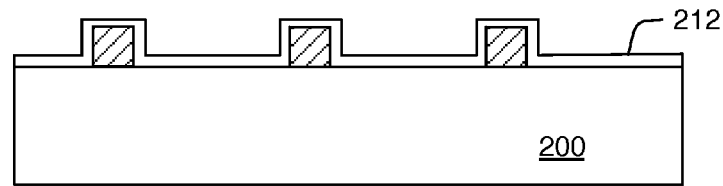
Figure 2F:
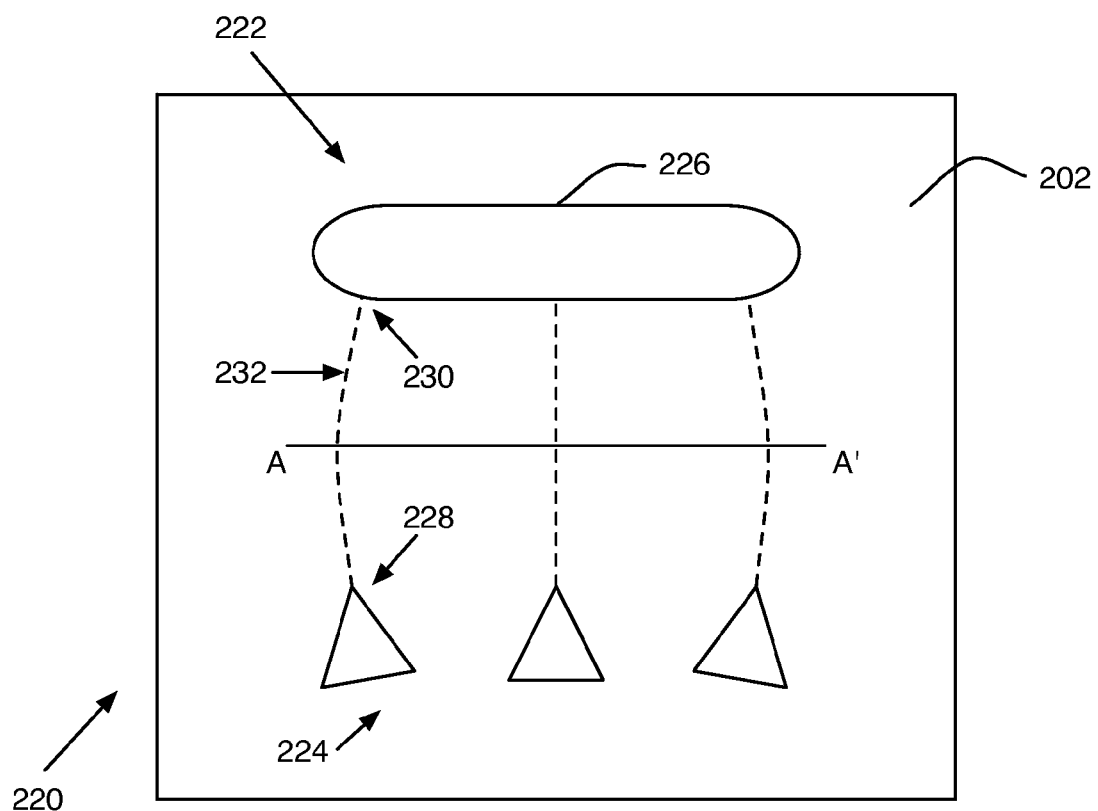

For example, FIG. 2F, illustrates a top-down view of substrate portion 220 where several features 222 have been patterned into portion 220 using known techniques. In this example, FIGS. 2A-2E represent cross-sectional views taken along line A-A' shown in FIG. 2F. Features 222 include a set of triangular-shaped features 224 exhibiting sharp angled edges on surface 202 and an elongate oval feature 226 exhibiting smooth angled edges on surface 202. As noted above, features 222 may be formed on the order of 10 μm in depth in substrate portion 220. In the example of FIG. 2F, once layer 204 is formed on surface 202 and over features 222, and subsequently stress processed as described with regard to FIG. 2B, cracks 206 may be formed in layer 204 initiating at locations 228 on features 224 and terminating at locations 230 of feature 226 where cracks 206 follow paths 232 between locations 228 and 230. The shapes and distribution of features 222 depicted in FIG. 2F are provided for purely explanatory purposes and claimed subject matter is not limited in regard to the shapes and/or distributions of crack initiating features.

Returning to the discussion of FIGS. 2A-2E, in FIG. 2C, conductive material 208 may be disposed in cracks 206 using any of the metal deposition techniques discussed above with regard to FIG. 1C. In some implementations, conductive material 208 may include copper, aluminum, tungsten or any combination thereof, although other embodiments are not limited in this regard. Techniques described herein for forming conductive material 208 may be performed at temperatures of less than about 350° C. Subsequently, as shown in FIG. 2D, strained layer 204 may be removed by etching to yield nanowires 210 on surface 202 of substrate 200.

As shown in FIG. 2E, nanowires 210 may be encapsulated in insulating material 212 using any of the encapsulation techniques discussed above with regard to FIG. 1E. Thus, as described above, in some implementations, insulating material 212 may include $SiO_2$ that has been deposited using SAM techniques. Techniques described herein for forming insulating material 212 may be performed at temperatures of less than about 350° C.

Figure 3:
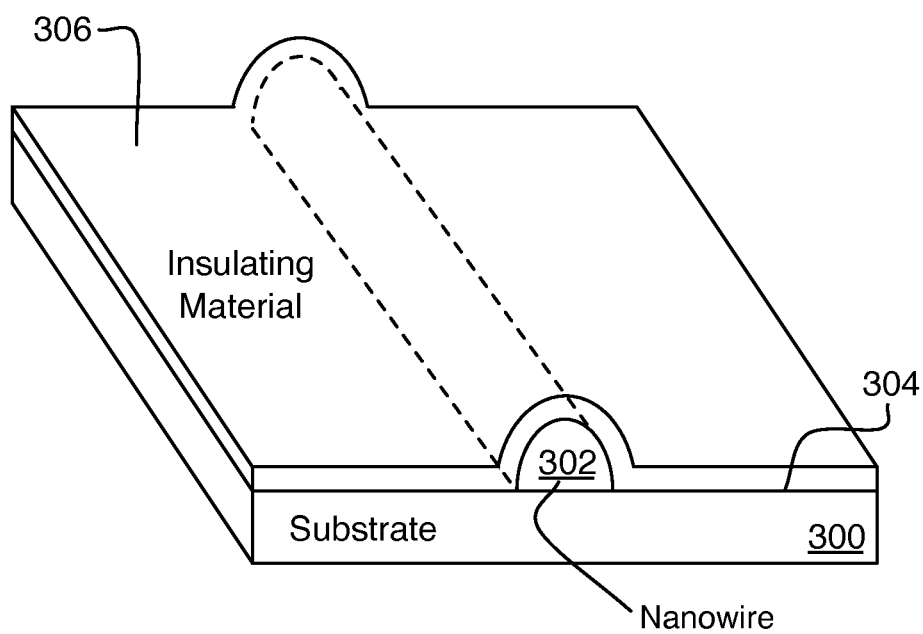
FIG. 3 illustrates an example encapsulated nanowire.

FIG. 3 illustrates a nanowire 302 encapsulated on a surface 304 of substrate 300 by an insulating material 306. Nanowire 302 may be formed by any of the techniques described above with regard to FIGS. 1A-E and 2A-F and may include metal such as copper, aluminum, tungsten or any combination thereof. In FIG. 3, insulating material 306 encapsulating nanowire 302 may be formed by any of the techniques described above with regard to FIGS. 1A-E and 2A-F and may include silicon dioxide or any passivating material otherwise compatible with semiconductor processing schemes such as silicon nitride. In some implementations, as described above in reference to FIGS. 1 and 2, insulating material 306 may have a thickness of less than about 5 nm.

Figure 4:
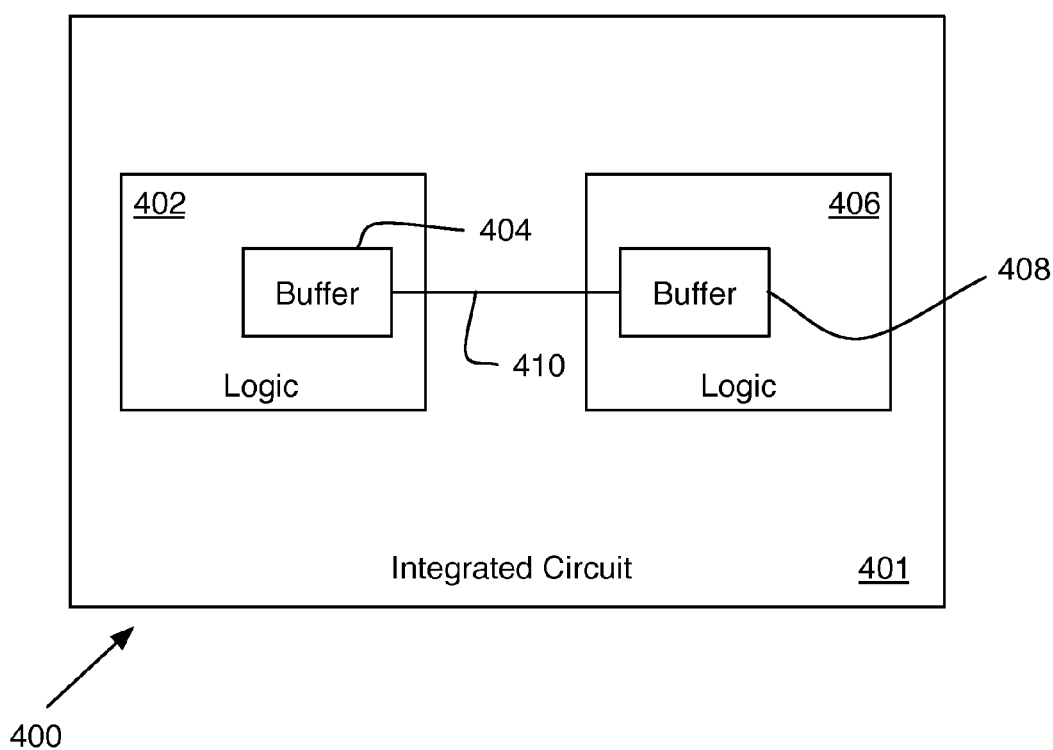
FIG. 4 illustrates an example integrated circuit incorporating an encapsulated nanowire.

FIG. 4 illustrates a block diagram of a portion of an integrated circuit (IC) 400, such as a portion of a microprocessor, formed on a substrate 401. IC 400 includes a logic module 402 including a buffer circuit 404 and another logic module 406 including a buffer circuit 408. IC 400 also includes an encapsulated nanowire 410, such as nanowire 302 of FIG. 3, communicatively coupling module 402 with module 406 via respective buffer circuits 404 and 408. Encapsulated nanowire 410 may be formed using any of the techniques described herein. Further, in some implementations, the insulating material (not depicted in FIG. 4) encapsulating nanowire 410 may, as described above in reference to FIGS. 1A-E and 2A-F, have a thickness of less than about 5 nm.

In some implementations, logic module 402 may be configured to generate a high frequency signal and to convey that signal from buffer circuit 404 to buffer circuit 408 of logic module 406 using nanowire 410. For example, logic module 402 may include clock signal generation logic and logic module 406 may include logic configured to use the clock signal provided by logic module 402. In another example, logic module 402 may receive a high frequency signal from other logic (not shown) and may convey that signal to logic module 406 using nanowire 410. The foregoing examples are just a few of many possible implementations and claimed subject matter is not limited in this regard. Further, while FIG. 4 shows one nanowire 410 communicatively coupling module 402 with module 406, claimed subject matter is not limited in this regard and more than one nanowire may be used to convey signals between modules, ICs, etc. In addition, claimed subject matter is not limited with regard to the type of signals conveyed over one or more nanowires. For example, while nanowire 410 may convey a single-ended signal between module 402 and 406, multiple nanowires 410 may be employed to convey other signal types such as fully-differential signals between module 402 and 406.

Figure 5:
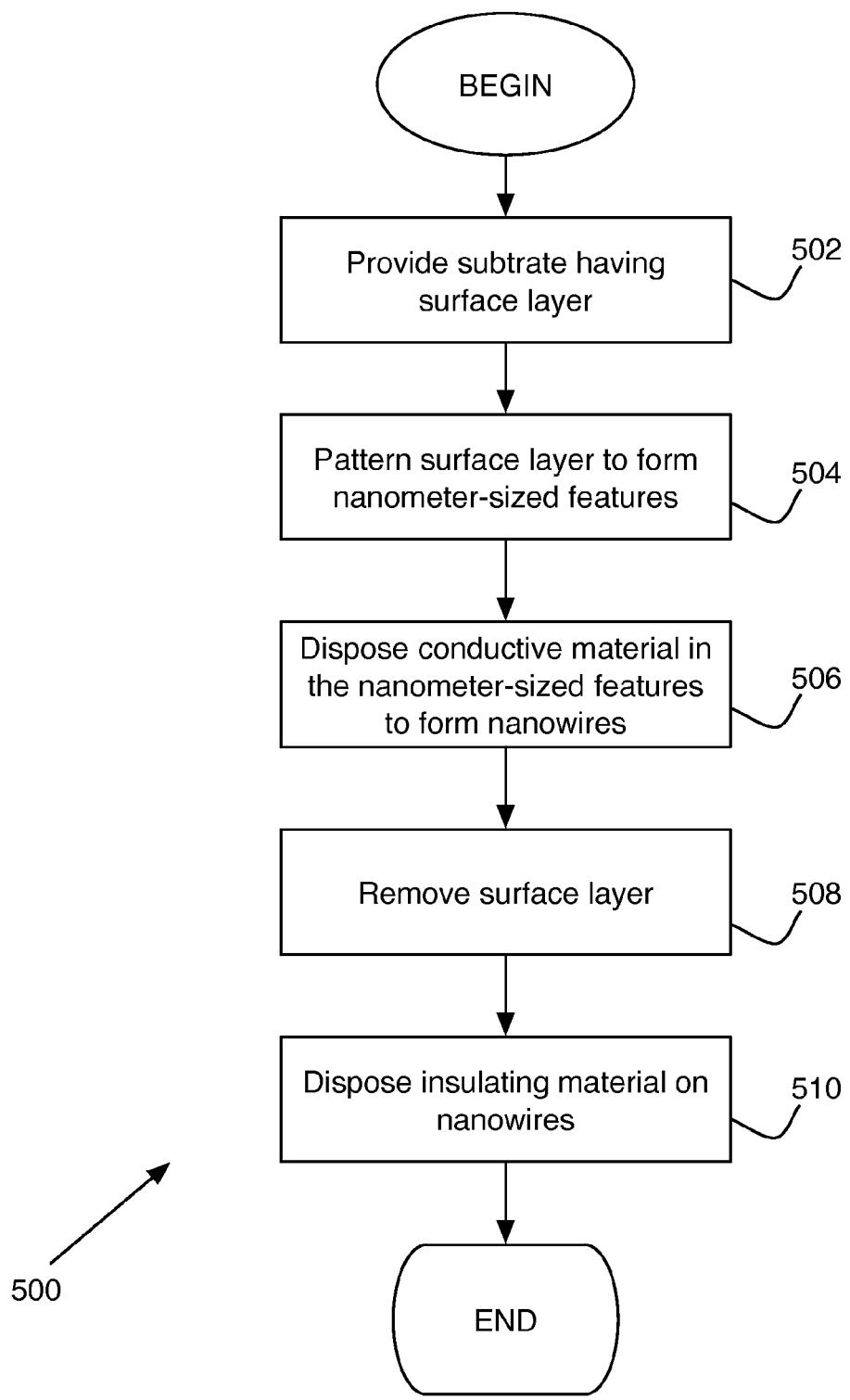
FIG. 5 is a flow chart illustrating a method for fabricating encapsulated nanowires.

FIG. 5 illustrates an example process 500 for generating encapsulated nanowires. While process 500 sets forth various acts and/or events, none of those acts and/or events should be viewed as limiting claimed subject, and further, those skilled in the art will recognize that numerous alternatives to the acts and/or events shown in FIG. 5 may be practiced in accordance with claimed subject matter.

Process 500 begins with the act 502 of providing a substrate having a surface layer. For example, referring to the discussion of FIGS. 1A and 1B, in one implementation act 502 may include, respectively, providing substrate 100 having surface photoresist layer 104 or providing substrate 200 having a surface layer 204 of stressed silicon. In act 504, the surface layer may be patterned to form nanometer-sized features in the surface layer. For example, in one implementation, act 504 may involve patterning photoresist layer 104 using lithographic techniques, such as nanoimprint lithography, to form features 106 as described above with respect to FIG. 1B. In another example, referring to the description of FIGS. 2B and 2F, act 504 may be undertaken by causing stressed silicon dioxide layer 204 to fracture thereby forming nanometer-sized cracks 206.

In act 506, conductive material may be disposed in the nanometer-sized features. In the illustrative embodiments of FIGS. 1C and 2C, metal may be deposited in features 108 and 208 respectively by using the super critical carbon dioxide techniques described herein. In act 508, the patterned surface layer may be removed. As described above with regard to FIGS. 1D and 2D, the surface layer (e.g., patterned photoresist layer 104 or cracked silicon dioxide layer 204) may be removed by etching to yield nanowires 110 and 210 respectively. Finally, in act 510, insulating material may be disposed on the nanowires. As described above with regard to FIGS. 1E and 2E, act 510 may be undertaken to coat nanowires 110 or 210 in insulating material by forming one or more SAMs on the nanowires.

Claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a storage medium or storage media. This storage media, such as CD-ROMs, computer disks, flash memory, or the like, for example, may have instructions stored thereon, that, when executed by a system, such as a computer system, computing platform, or other system, for example, may result in execution of a processor in accordance with claimed subject matter, such as one of the implementations previously described, for example. As one possibility, a computing platform may include one or more processing units or processors, one or more input/output devices, such as a display, a keyboard and/or a mouse, and one or more memories, such as static random access memory, dynamic random access memory, flash memory, and/or a hard drive.

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations. Moreover, when terms or phrases such as "coupled" or "responsive" or "in response to" or "in communication with", etc. are used herein or in the claims that follow, these terms should be interpreted broadly. For example, the phrase "coupled to" may refer to being communicatively, electrically and/or operatively coupled as appropriate for the context in which the phrase is used.

In the preceding description, various aspects of claimed subject matter have been described. For purposes of explanation, specific numbers, systems and/or configurations were set forth to provide a thorough understanding of claimed subject matter. However, it should be apparent to one skilled in the art and having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now, or in the future, occur to those skilled in the art. It is, therefore, to be understood that the appended claims are intended to cover all such modifications and/or changes as fall within the true spirit of claimed subject matter.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed:

1. An integrated circuit, comprising:
a first buffer circuit;
a second buffer circuit;
a nanowire communicatively coupling the first buffer circuit to the second buffer circuit; and
an insulating material disposed over the nanowire,
wherein the insulating material has a thickness of less than 5 nm.

2. The integrated circuit of claim 1, wherein the nanowire comprises copper, aluminum, tungsten or any combination thereof.

3. The integrated circuit of claim 1, wherein the insulating material comprises silicon dioxide.

4. The integrated circuit of claim 1, further comprising:
a logic module including the first buffer circuit,
wherein the logic module is configured to convey a high frequency signal from the first buffer circuit to the second buffer circuit via the nanowire.

5. The integrated circuit of claim 4, wherein the high frequency signal comprises a clock signal.

6. The integrated circuit of claim 4, wherein the logic module comprises clock signal generation logic.

7. An integrated circuit, comprising:
a first buffer circuit;
a second buffer circuit;
a first nanowire;
a second nanowire;
the first nanowire and second nanowire configured to convey a fully-differential signal to communicatively couple the first buffer circuit to the second buffer circuit; and
an insulating material disposed over the first nanowire and second nanowire,
wherein the insulating material has a thickness of less than 5 nm.

8. The integrated circuit of claim 7, wherein the first nanowire comprise copper, aluminum, tungsten or any combination thereof.

9. The integrated circuit of claim 7, wherein the insulating material comprises silicon dioxide.

10. The integrated circuit of claim 7 further comprising:
a logic module including the first buffer circuit,
wherein the logic module is configured to convey a high frequency signal from the first buffer circuit to the second buffer circuit via the first and second nanowires.

11. The integrated circuit of claim 10, wherein the high frequency signal comprises a clock signal.

12. The integrated circuit of claim 10, wherein the logic module comprises clock signal generation logic.

13. An integrated circuit, comprising:
a first buffer circuit;
a second buffer circuit;
a nanowire communicatively coupling the first buffer circuit to the second buffer circuit; and
one or more insulating monolayers of silicon dioxide disposed over the nanowire to entirely encapsulate the nanowire,
wherein each of the one or more insulating monolayers of silicon dioxide has a thickness of less than 0.5 nm.

14. The integrated circuit of claim 13, wherein the nanowire comprises copper, aluminum, tungsten or any combination thereof.

15. The integrated circuit of claim 13 further comprising:
a logic module including the first buffer circuit,
wherein the logic module is configured to convey a high frequency signal from the first buffer circuit to the second buffer circuit via the nanowire.

16. The integrated circuit of claim 15, wherein the high frequency signal comprises a clock signal.

17. The integrated circuit of claim 16, wherein the logic module comprises clock signal generation logic.

* * * * *

UNITED STATES PATENT AND TRADEMARK OFFICE
CERTIFICATE OF CORRECTION

| | | |
|---|---|---|
| PATENT NO. | : 8,664,539 B2 | Page 1 of 1 |
| APPLICATION NO. | : 13/371782 | |
| DATED | : March 4, 2014 | |
| INVENTOR(S) | : Kruglick | |

It is certified that error appears in the above-identified patent and that said Letters Patent is hereby corrected as shown below:

On the Title Page

On Page 2, in item (56), under "OTHER PUBLICATIONS", in Column 1, Line 7, delete "SiO2" and insert -- $SiO_2$ --, therefor.

In the Drawings

In Fig. 5, Sheet 6 of 6, for Tag "502", in Line 1, delete "subtrate" and insert -- substrate --, therefor.

In the Specification

In Column 2, Line 57, delete "substrate 102" and insert -- substrate 100 --, therefor.

In Column 2, Lines 64-65, delete "lithography)," and insert -- lithography, --, therefor.

Signed and Sealed this
First Day of July, 2014

Michelle K. Lee
*Deputy Director of the United States Patent and Trademark Office*